(12) United States Patent
Vogt (10) Patent No.: US 8,763,912 B1
(45) Date of Patent: Jul. 1, 2014

(54) DUAL INTERFACE MODULE AND DUAL INTERFACE CARD HAVING A DUAL INTERFACE MODULE

(71) Applicant: Identive Group, Inc., Santa Ana, CA (US)

(72) Inventor: Werner Vogt, Remetschwil (CH)

(73) Assignee: Identive Group, Inc., Santa Ana, CA (US)

( * ) Notice: Subject to any disclaimer, the term of this patent is extended or adjusted under 35 U.S.C. 154(b) by 0 days.

(21) Appl. No.: 13/853,582

(22) Filed: Mar. 29, 2013

(51) Int. Cl.
*G06K 7/08* (2006.01)
*G06K 19/02* (2006.01)

(52) U.S. Cl.
USPC ............ 235/488; 235/380; 235/451; 235/492

(58) Field of Classification Search
USPC .................................. 235/375, 451, 488, 492
See application file for complete search history.

(56) References Cited

U.S. PATENT DOCUMENTS

| | | | | |
|---|---|---|---|---|
| 5,898,215 A | * | 4/1999 | Miller et al. | 257/679 |
| 7,253,024 B2 | * | 8/2007 | Yu et al. | 438/107 |
| 2006/0054709 A1 | * | 3/2006 | Lee | 235/492 |
| 2006/0255157 A1 | * | 11/2006 | Launay et al. | 235/492 |
| 2008/0191029 A1 | * | 8/2008 | Deloche | 235/492 |
| 2009/0151150 A1 | * | 6/2009 | Ayala et al. | 29/600 |

* cited by examiner

*Primary Examiner* — Tuyen K Vo
(74) *Attorney, Agent, or Firm* — Proskauer Rose LLP (57) ABSTRACT

A dual interface module comprises a substrate layer having at least two first through-holes, two contact pads on a first side of the substrate, at least two connection pads on a second side of the substrate, at least one electronic element on the second side of the substrate, an antenna pad comprising an antenna on the second side of the substrate, at least two first connection elements in the first through-holes, each first element electrically connecting one of the contact pads with one of the connection pads, at least two second connection elements, each second element electrically connecting one of the connection pads with the electronic element, and two third connection elements, each third element electrically connecting the electronic element with the antenna pad. The module can be arranged on a plastic card body or in a cavity in a plastic card body to form a dual interface card.

38 Claims, 9 Drawing Sheets

DUAL INTERFACE MODULE AND DUAL INTERFACE CARD HAVING A DUAL INTERFACE MODULE

FIELD OF THE INVENTION

The subject matter of the application relates generally to a dual interface module and a dual interface card having a dual interface module, and to methods for manufacturing the same.

BACKGROUND

As the use of plastic cards for credit cards, identification cards and the like continues to become more widespread, credit card fraud and identification card fraud are becoming increasing problems. The ease in which criminals have been able to manufacture or manipulate known cards is a result of the existence of the easily-altered magnetic stripe storage medium used by current cards. These magnetic stripes are easy to program and reprogram using commonly available technology, resulting, e.g., in so-called magnetic stripe cloning.

Thus, there is a need in the plastic card industry to provide a more secure plastic card that is more difficult or nearly impossible to duplicate or to manipulate. The likely successor to the magnetic stripe cards is known as a memory card or smart card. The smart card can generally be described as a card having an integrated circuit with memory that is capable of securely storing data and/or executing processing functions.

Contact smart cards make contact through several contact pads place on the surface of the card. These pads provide electrical connectivity when inserted into a reader, which is typically used as a communications medium between the smart card and a host. Cards typically do not contain batteries—power is supplied by the card reader—through some of these contact pads.

The most recent development in smart cards is a contactless card that interacts with a terminal reader using electromagnetic coupling. The smart card incorporates an inlay that is a symmetrical substrate incorporating a micro chip bounded to an antenna and functioning as the heart of a radio-frequency identification (RFID) part, a near field communication (NFC) chip, or similar chip credential. This smart card requires only proximity to a reader antenna to communicate. Contactless cards also typically operate without batteries and obtain power through induction from the electromagnetic field of the reader antenna. When in proximity to a reader antenna, they accumulate charge from the electromagnetic field, power up and consequently respond to commands over the same radio frequency channel, communicating in a bi-directional manner. Contactless technology is rapidly replacing traditional machine readable identification technologies in numerous applications such as those employing bar codes and magnetic stripes, offering substantially enhanced security and convenience.

For some applications it is preferred to provide a smart card that allows insertion into a reader, as well as contactless interaction. These so-called dual-interface cards implement contactless and contact interfaces on a single card, sometimes with some shared storage and processing. However, when manufacturing such cards, the electrical connections of a dual interface module that include the chip and the contact pads for contact operation, as well as an antenna with contacts for contactless operation that are embedded in the same card body, causes problems.

SUMMARY

Therefore, what is needed is a dual interface module that can be used to produce a dual interface card that does not have to be connected to a separate antenna when making a personalized plastic card.

This objective is achieved by the techniques described herein, namely, a dual interface module comprising a substrate layer, comprising at least two first through-holes, at least two contact pads which are arranged on a first side of the substrate layer, at least two connection pads which are arranged on a second side of the substrate layer, at least one electronic element that is arranged on the second side of the substrate layer, an antenna pad comprising an antenna that is arranged on the second side of the substrate layer, at least two first connection elements arranged in the first through-holes, where each first connection element electrically connects one of the contact pads with one of the connection pads, at least two second connection elements, wherein each second connection element electrically connects one of the connection pads with the electronic element, and two third connection elements, wherein each third connection element electrically connects the electronic element with an antenna pad. Further, this dual interface module can be arranged in a cavity in a plastic card body to form a dual interface card.

The invention, in one aspect, features a method for manufacturing a dual interface module. A substrate layer is provided. At least one dual interface section is formed on the substrate layer. At least two first through-holes are formed in the substrate layer in each dual interface section. A first connection element is arranged in each first through-hole, electrically connecting each first connection element to a contact pad that is arranged on a first side of the substrate layer. Each first connection element is electrically connected to a connection pad that is arranged on a second side of the substrate layer. At least one electronic element is arranged on the second side of the substrate layer in each dual interface section, where the electronic element is electrically connected to each of the connection pads in the same dual interface section. An antenna pad is arranged on the second side of the substrate layer in each dual interface section, where each electronic element is electrically connected to the antenna pad in the same dual interface section.

In some embodiments, the at least one electronic element is electrically connected to each of the connection pads in the same dual interface section via a second connection element and electrically connected to the antenna pad in the same dual interface section via two third connection elements and all second connection elements and all third connection elements are wire bonds.

In some embodiments, the at least one electronic element is electrically connected to each of the connection pads in the same dual interface section via flip chip connections and electrically connected to the antenna pad in the same dual interface section via flip chip connections. In some embodiments, the first connection elements are provided by covering the walls of the first through-holes with an electrically conductive material.

In some embodiments, the contact pads are provided by plating the whole first side of the substrate layer with a metal and then partly removing said metal via etching to form the contact pads. In some embodiments, the connection pads are provided by plating the whole second side of the substrate layer with a metal and then partly removing said metal via etching to form the connection pads. In some embodiments, the electrically conductive material and the metal are gold, nickel-gold, silver, tin, tin-lead, or cadmium.

In some embodiments, several dual interface sections are formed on the substrate layer and several dual interface modules are produced by cutting each dual interface section out of the substrate layer. This technique allows the easy and efficient production of several dual interface modules.

In some embodiments, any of the above aspects can include one or more of the following features. In some embodiments, the substrate layer comprises an epoxy laminate that allows high reliability and performance of the dual interface module due to its low dielectric constant. Said epoxy laminate may be a glass tape that is impregnated in an epoxy resin. Optionally, said epoxy laminate may be laminated with a copper layer.

In some embodiments, the substrate layer comprises a polyimide film. In some embodiments, the substrate layer comprises a polyethylene terephthalate film. In some embodiments, the substrate layer comprises a transparent material to allow the antenna to be visible when looking at the dual interface module from the first side of the substrate layer. In some embodiments, the substrate layer has a thickness especially in the range from 100 μm to 150 μm. In some embodiments, the first side of the substrate layer is printed, e.g., via dye sublimation printing.

To allow good electrical contacting of the electronic element via the contact pads, in some embodiments said contact pads are comprised of gold. In some embodiments, the contact pads are comprised of nickel-gold, silver, tin, tin-lead, or cadmium. In some embodiments, the contact pads have a thickness in the range from 20 μm to 60 μm to allow sufficient stability of the contact pads and a smaller increase in the thickness of those areas of the substrate layer that are padded with the contact pads, when compared to the unpadded part of the substrate layer. In some embodiments, the contact pads cover a first part of the substrate layer and do not cover a second part of the substrate layer. The antenna pad is only arranged in a part of the second side of the substrate layer to prevent the antenna from being partly shielded by the contact pads. In some embodiments, said connection pads also consist of gold. In some embodiments, each connection pad comprises a through-hole that is an extension of the first through-hole of the substrate layer.

In some embodiments, the electronic element is a chip comprising a radio frequency identification (RFID) part, a near field communication (NFC) chip, or a similar dual interface device.

In some embodiments, the second connection elements and the third connection elements are wire bonds. In some embodiments, the second connection elements and the third connection elements are flip chip connection elements. In some embodiments, when the second connection elements and the third connection elements are flip chip connection elements, a covering layer is arranged on the contact pads and on the antenna pads. In some embodiments, the substrate layer and the covering layer comprise the same material, i.e., an epoxy laminate. However, the covering layer may generally comprise any electrically insulating material. In some embodiments, the sum of the thickness of the covering layer and the thickness of the antenna pad is at least equal to the thickness of the electronic element.

The invention, in another aspect, features a dual interface card comprising a plastic card body, a cavity arranged in the plastic card body, and the dual interface module described herein arranged in the cavity. It should be appreciated that although a card is described as an exemplary embodiment, other physical articles (e.g., tags, labels, stickers and the like) can be used in conjunction with the techniques described herein without departing from the scope of the invention.

In some embodiments, at least one optic or haptic characteristic of the substrate layer is equal to the same optic or haptic characteristic of the plastic card body to provide the dual interface card with a uniform appearance. In some embodiments, the plastic card body consists of polyvinyl chloride.

In some embodiments, the cavity comprises an indention and the substrate layer, the contact pads, the antenna pad and the first connection elements are completely arranged outside of the indention, the electronic element is arranged inside and outside of the indention, the connection pads are arranged at least outside of the indention, and the second connection elements and the third connection elements are arranged at least inside the indention. Since the electronic element is the biggest component arranged on the substrate layer, forming the indention to partly accept the electronic element allows positioning the dual interface module in the plastic card body by removing little material from the plastic card body.

In some embodiments, an adhesive layer is arranged between the antenna pad of the dual interface module and the plastic card body to fix the dual interface module in the card body. In some embodiments, the depth of the cavity, not including the depth of the indention, is at least equal to the sum of the thickness of the substrate layer, the antenna pad and the adhesive layer to avoid the substrate layer to elevate above the surface of the plastic card body. In some embodiments, the depth of the cavity not including the depth of the indention, is equal to the sum of the thickness of the substrate layer, the antenna pad, the adhesive layer and the contact pads, so that the contact pads are level with the surface of the plastic card body. In some embodiments, a resin is arranged inside the indention to fix the electronic element in the indention. Said resin may be an adhesive, i.e., the same adhesive forming the adhesive layer between the plastic card body and the antenna pad.

In some embodiments, the dual interface module comprises a covering layer arranged on the contact pads and on the antenna pad, and an adhesive layer is arranged between the covering layer of the dual interface module and the plastic card body. In some embodiments, the depth of the cavity is at least equal to the sum of the thickness of the substrate layer, the antenna pad, the covering layer and the adhesive layer to avoid the substrate layer to elevate above the surface of the plastic card body. In some embodiments, the depth of the cavity is equal to the sum of the thickness of the substrate layer, the antenna pad, the covering layer, the adhesive layer and the contact pads, so that the contact pads are level with the surface of the plastic card body.

The invention, in another aspect, features a method for manufacturing a dual interface card, the method comprising providing a plastic card body, forming a cavity in the plastic card body, and bonding a dual interface module of the invention in the cavity using an adhesive. In some embodiments, an indention is formed in the cavity and a portion of the electronic element of the dual interface module is arranged in the indention. In some embodiments, a resin is inserted in the indention before bonding the dual interface module in the cavity. Said resin may be an adhesive, i.e. the same adhesive forming the adhesive layer between the plastic card body and the antenna pad.

The invention, in another aspect, features a dual-interface card, comprising a plastic card body and the dual interface module described herein comprising a covering layer arranged on the contact pads and on the antenna pad. The dual interface module is arranged on the plastic card body, where the substrate layer of the dual interface module covers the whole surface of the plastic card body and an adhesive layer is arranged between the covering layer of the dual interface module and the plastic card body.

The invention, in another aspect, features a method for manufacturing a dual interface card, the method comprising providing a plastic card body and bonding the dual interface module described herein comprising a covering layer arranged on the contact pads and on the antenna pad on the plastic card body using an adhesive, so that the substrate layer of the dual interface module covers the whole surface of the plastic card body.

The invention, in another aspect, features a dual-interface card, comprising a plastic card body, an indention arranged in the plastic card body, and the dual interface module described herein arranged on the plastic card body and in the indention, where the substrate layer of the dual interface module covers the whole surface of the plastic card body. In some embodiments, an adhesive layer is arranged between the antenna pad of the dual interface module and the plastic card body. In some embodiments, a resin is arranged inside the indention.

The invention, in another aspect, features a method for manufacturing a dual interface card, the method comprising providing a plastic card body, forming an indention in the plastic card body, and bonding the dual interface module described herein on the plastic card body using an adhesive, so that the substrate layer of the dual interface module covers the whole surface of the plastic card body, where a portion of the electronic element of the dual interface module is arranged in the indention. In some embodiments, a resin is inserted in the indention before bonding the dual interface module in the cavity.

Other aspects and advantages of the invention will become apparent from the following detailed description, taken in conjunction with the accompanying drawings, illustrating the principles of the invention by way of example only.

BRIEF DESCRIPTION OF THE DRAWINGS

The advantages of the invention described above, together with further advantages, may be better understood by referring to the following description taken in conjunction with the accompanying drawings. The drawings are not necessarily to scale, emphasis instead generally being placed upon illustrating the principles of the invention.

DETAILED DESCRIPTION

Figure 1:
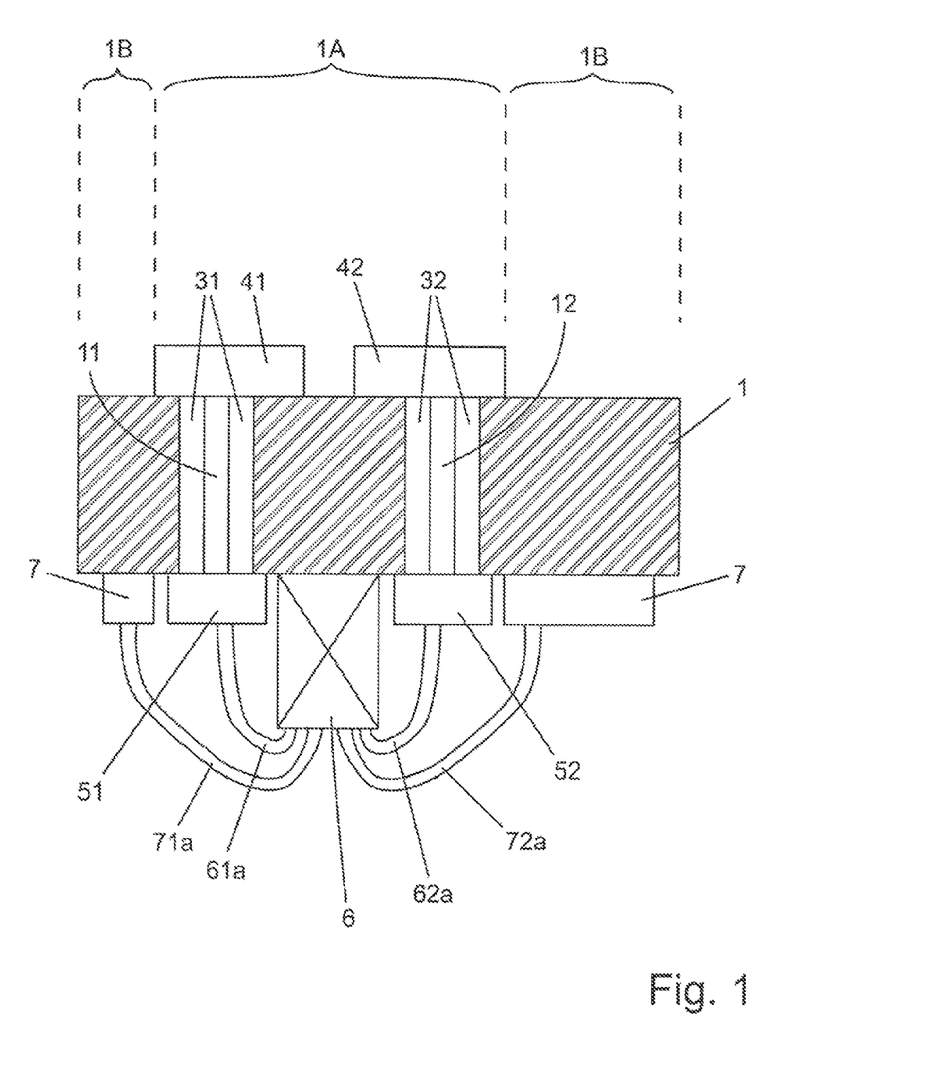
FIG. 1 shows a cross-sectional view of a dual interface module according to an embodiment of the invention.
Figure 3:
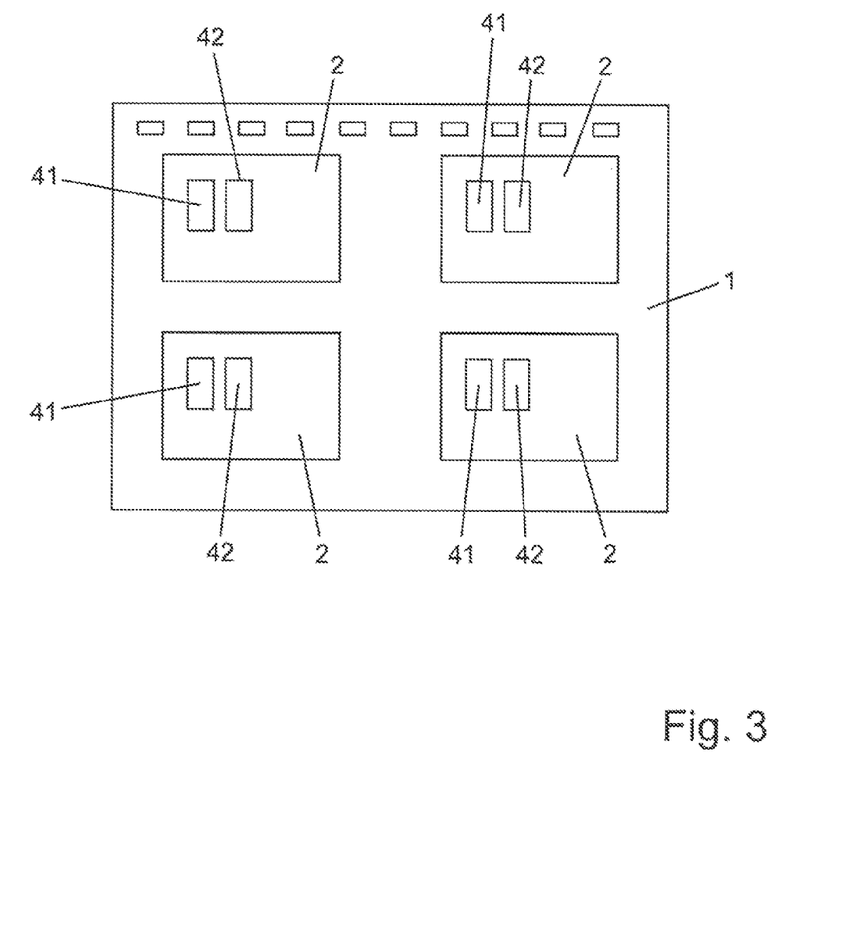
FIG. 3 shows a top view of a substrate layer with several dual interface sections according to an embodiment of the invention.

FIG. 1 shows a cross-sectional view of a dual interface module according to an embodiment of the invention. Said dual interface module can be cut out from a substrate layer 1 with several dual interface sections 2 as shown in FIG. 3. The substrate layer 1 typically consists of a 125 μm thick epoxy laminate. Several dual interface sections 2 are formed on the substrate layer 1 (see FIG. 3). In each dual interface section 2 two first through-holes 11, 12 are formed in the substrate layer 1. A first connection element 31, 32 is arranged in each first through-hole 11, 12 by plating the walls of each first through-hole 11, 12 with gold or similarly advantageous conducting plating material. Each first connection element 31, 32 is electrically connected to a gold or other similar conductive material plated contact pad 41, 42 that is arranged on a first side of the substrate layer 1 in a first part 1A of the substrate layer. Each contact pad 41, 42 has an approximate thickness of 40 μm.

Moreover, each first connection element 31, 32 is electrically connected to a gold or other similar plated material connection pad 51, 52 that is arranged on a second side of the substrate layer. Each connection pad 51, 52 has an approximate thickness of 40 μm. A dual interface RFID chip 6 is arranged on the second side of the substrate layer 1 in each dual interface section 2. The dual interface RFID chip 6 is electrically connected to each of the connection pads 51, 52 in the same dual interface section 2 via first wire bonds 61a, 62a. An antenna pad 7 comprising an antenna (not shown) is arranged on the second side of the substrate layer 1 in a second part 1B of the substrate layer 1 in each dual interface section 2. Each dual interface RFID chip 6 is electrically connected to the antenna pad 7 in the same dual interface section via second wire bonds 71a, 72a.

Figure 2:
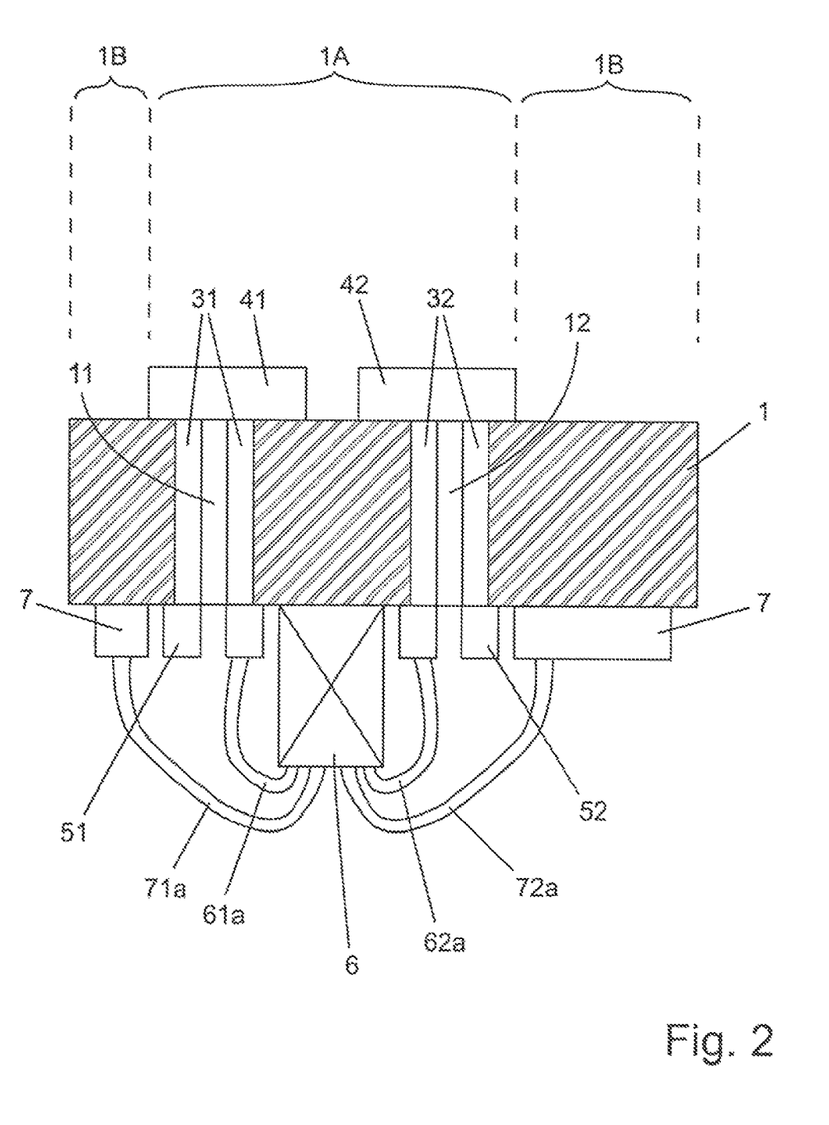
FIG. 2 shows a cross-sectional view of a dual interface module according to another embodiment of the invention.

In another embodiment shown in FIG. 2, each connection pad 51, 52 includes a through-hole that is an extension of through-hole 11, 12 of the substrate layer 1. This allows easy plating of the walls of each first through-hole 11, 12 with gold or similar conductive plating material.

Figure 4:
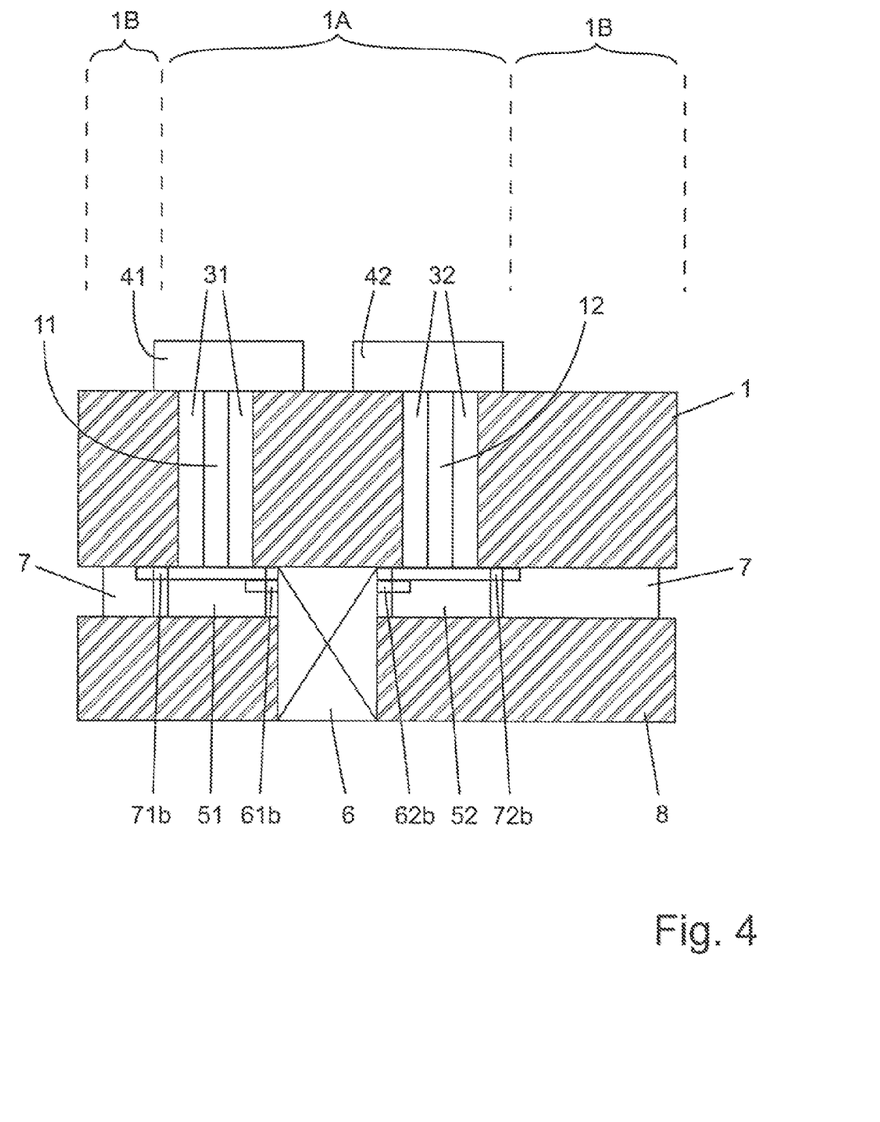
FIG. 4 shows a cross-sectional view of a dual interface module according to another embodiment of the invention.

Another embodiment shown in FIG. 4 does not include wire bonds. Instead, the connection pads 51, 52, the dual interface RFID chip 6, and the antenna pad 7 are electrically connected via flip chip connections 61b, 62b, 71b, 72b. A covering layer 8 consisting of an epoxy laminate is arranged parallel to the substrate layer 1, covering all connection pads 51, 52 and the antenna pad 7. A hole in the covering layer 8 houses a part of the RFID chip 6 so that the surface of the RFID chip 6 that faces away from the substrate layer 1 forms a plane with the surface of the covering layer 8 that also faces away from the substrate layer 1.

Figure 5:
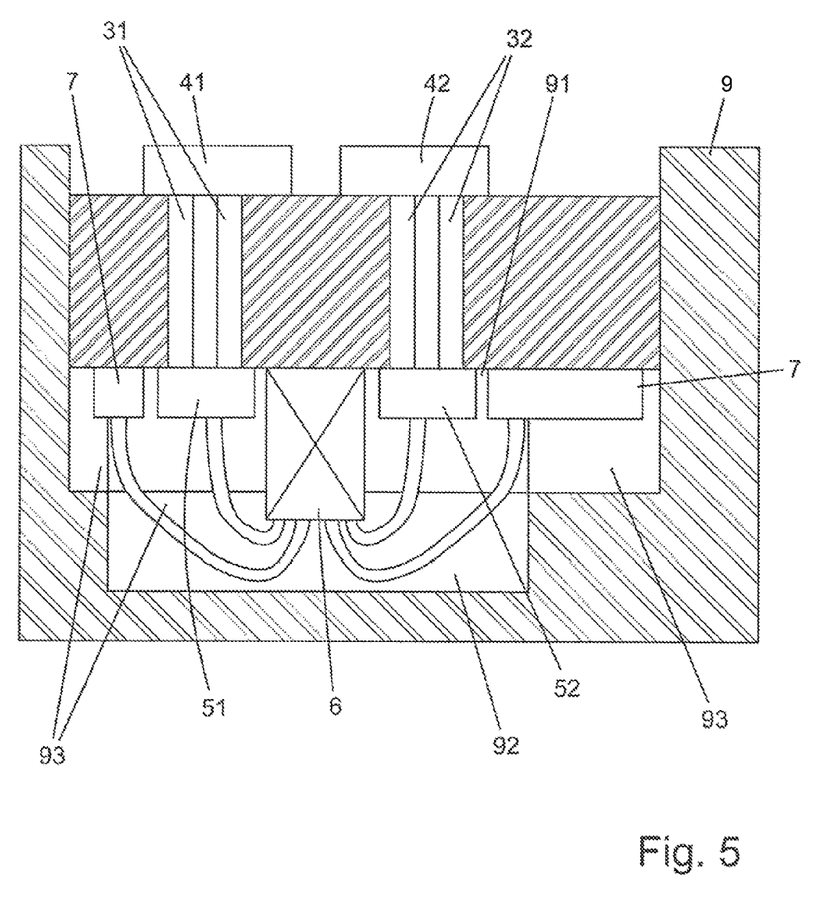
FIG. 5 shows a cross-sectional view of an embodiment of a plastic card including a dual interface module according to FIG. 1.

In an embodiment shown in FIG. 5, the production of a dual interface plastic card including the dual interface module according to FIG. 1 starts with providing a plastic card body 9. A cavity 91 is formed in the plastic card body 9, and an indention 92 is formed in the cavity 91. An adhesive layer 93 is arranged in the cavity 91 and in the indention 92. The substrate layer 1, the first connection elements 31, 32, the contact pads 41, 42, the connection pads 51, 52 and the antenna pad 7 are arranged in the cavity 91 and outside of the indention 92. The wire bonds 61a, 62a, 71a, 72a (not labeled) are arranged in the indention 92. The dual interface RFID chip 6 is arranged partly in the cavity 91 and partly in the indention 92. The adhesive layer 93 is cured to bond the dual interface module to the plastic card body 9. The depth of the cavity 91 not including the depth of the indention 92, is equal to the sum of the thickness of the substrate layer 1, the contact pads 41, 42, the antenna pads 7 and the adhesive layer 93.

Figure 6:
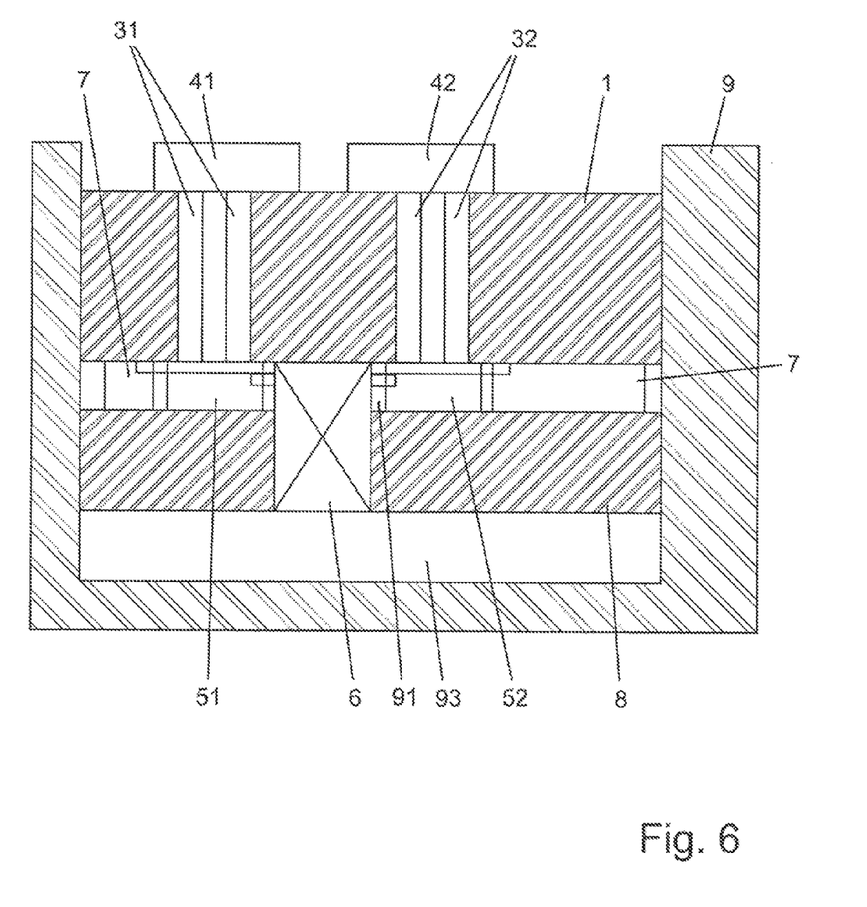
FIG. 6 shows a cross-sectional view of an embodiment of a plastic card including a dual interface module according to FIG. 4.

In another embodiment shown in FIG. 6, the production of a dual interface plastic card including the dual interface module according to FIG. 4 starts with providing a plastic card body 9. A cavity 91 is formed in the plastic card body 9. An adhesive layer 93 is arranged in the cavity 91. The whole dual interface module is arranged in the cavity 91. The adhesive layer 93 is cured to bond the dual interface module to the plastic card body 9. The depth of the cavity 91 is equal to the sum of the thickness of the substrate layer 1, the contact pads 41, 42, the antenna pad 7, the covering layer 8 and the adhesive layer 93.

Figure 7:
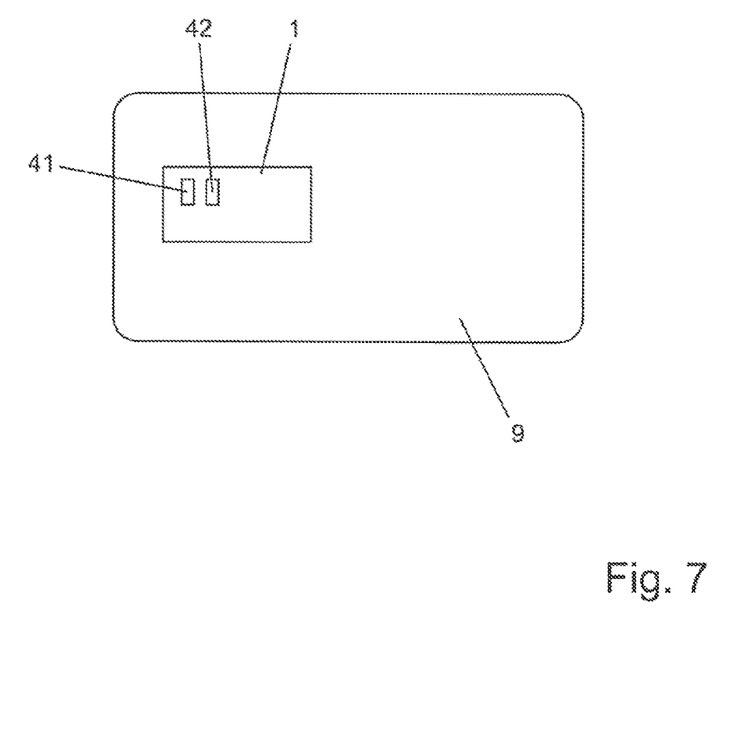
FIG. 7 shows a top view of a plastic card including a dual interface module according to an embodiment of the invention.

The embodiments shown in FIGS. 5 and 6 result in a dual interface plastic card with a mostly even surface as shown in FIG. 7. The surface of the plastic card body 9 and the contact pads 41, 42 are at the same level. The portion of the dual interface module that is not covered by the contact pads 41, 42 is lower by the thickness of the contact pads 41, 42. This difference in card thickness of 40 μm will not typically be noticed by a user. It is possible to personalize the plastic card using any known method.

The dual interface plastic card according to these embodiments may be easily produced since it is not necessary to make contact to an antenna in the plastic card body from the dual interface module. Instead, the complete antenna is provided inside the dual interface module.

Figure 8:
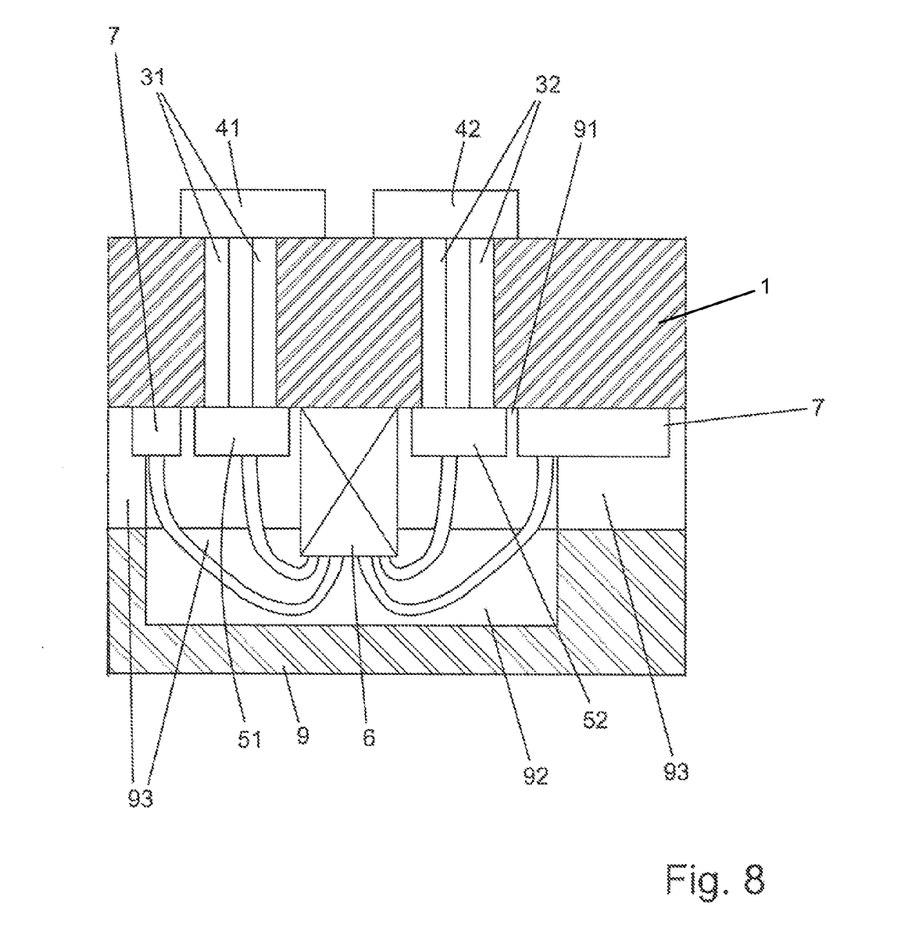
FIG. 8 shows a cross-sectional view of another embodiment of a plastic card including a dual interface module according to FIG. 1.

In another embodiment shown in FIG. 8, the production of a dual interface plastic card including the dual interface module according to FIG. 1 starts with a plastic card body 9. An indention 92 is formed in the plastic card body 9. An adhesive layer 93 is arranged on the plastic card body 9 and in the indention 92. The substrate layer 1, the first connection elements 31, 32, the contact pads 41, 42, the connection pads 51, 52 and the antenna pad 7 are arranged on the plastic card body 9. The wire bonds 61a, 62a, 71a, 72a (not labeled) and the dual interface RFID chip 6 are partially located in the indention 92. The substrate layer 1 covers the whole upper surface of the plastic card body 9. The adhesive layer 93 is cured to bond the dual interface module to the plastic card body 9.

Figure 9:
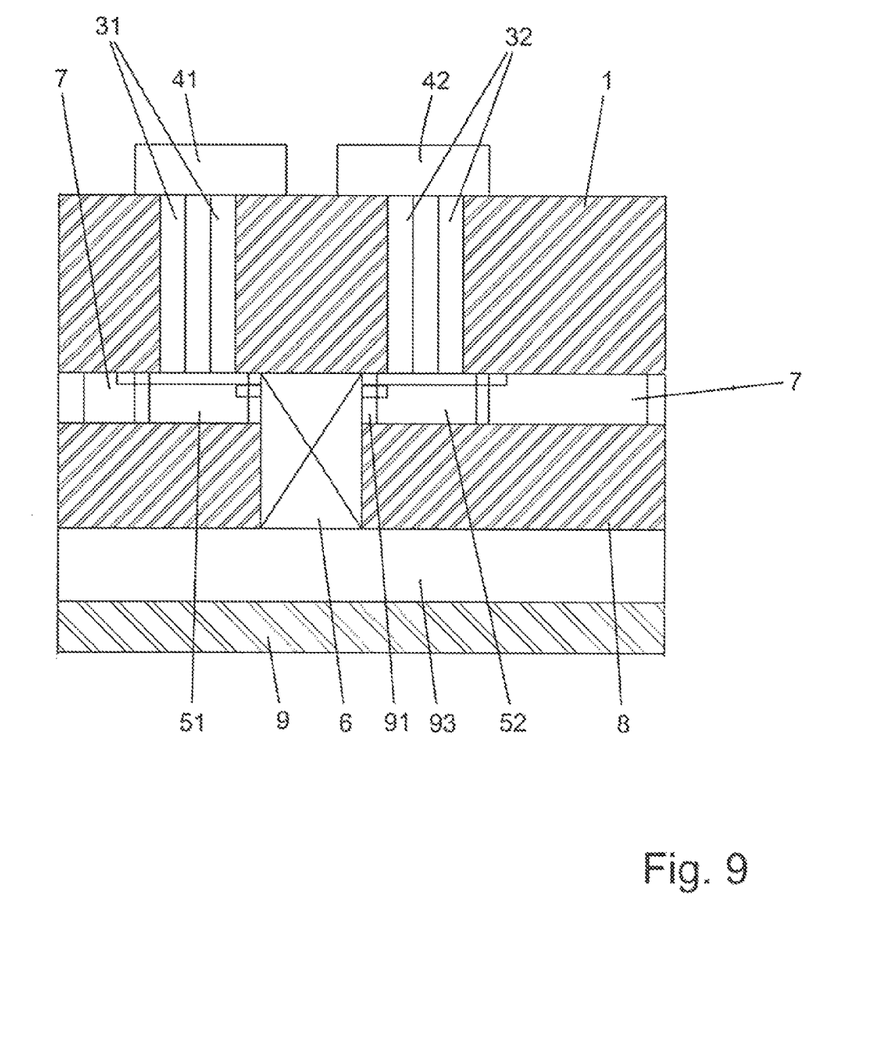
FIG. 9 shows a cross-sectional view of another embodiment of a plastic card including a dual interface module according to FIG. 4.

In another embodiment shown in FIG. 9, the production of a dual interface plastic card including the dual interface module according to FIG. 4 starts with a plastic card body 9. An adhesive layer 93 is arranged on the plastic card body 9. The dual interface module is arranged on the adhesive layer 93, so that the substrate layer 1 covers the whole upper surface of the plastic card body 9. The adhesive layer 93 is cured to bond the dual interface module to the plastic card body 9.

One skilled in the art will realize the invention may be embodied in other specific forms without departing from the spirit or essential characteristics thereof. The foregoing embodiments are therefore to be considered in all respects illustrative rather than limiting of the invention described herein.

What is claimed is:

1. A dual interface module comprising:
a substrate layer comprising two first through-holes;
at least two contact pads which are arranged on a first side of the substrate layer;
at least two connection pads which are arranged on a second side of the substrate layer;
at least one electronic element that is arranged on the second side of the substrate layer;
an antenna pad comprising an antenna that is arranged on the second side of the substrate layer;
at least two first connection elements arranged in the first through-holes, wherein each first connection element electrically connects one of the contact pads with one of the connection pads;
at least two second connection elements, wherein each second connection element electrically connects one of the connection pads with the electronic element; and
two third connection elements, wherein each third connection element electrically connects the electronic element with the antenna pad.

2. The dual interface module of claim 1, wherein the substrate layer comprises an epoxy laminate.

3. The dual interface module of claim 1, wherein the substrate layer comprises a transparent material.

4. The dual interface module of claim 1, wherein the substrate layer has a thickness in the range from 100 μm to 150 μm.

5. The dual interface module of claim 1, wherein the contact pads, the connection pads and the first connection elements are comprised of gold, nickel-gold, silver, tin, tin-lead, or cadmium.

6. The dual interface module of claim 1, wherein the contact pads have a thickness in the range from 20 μm to 60 μm.

7. The dual interface module of claim 1, wherein each connection pad comprises a through-hole that extends one of the first through-holes of the substrate layer.

8. The dual interface module of claim 1, wherein the contact pads cover a first part of the substrate layer and do not cover a second part of the substrate layer, and wherein the antenna pad is only arranged in a part of the second side of the substrate layer.

9. The dual interface module of claim 1, wherein the electronic element is a chip comprising a radio frequency identification (RFID) part, a near field communication (NFC) chip, or similar dual interface device.

10. The dual interface module of claim 1, wherein the second connection elements and the third connection elements are wire bonds.

11. The dual interface module of claim 1, wherein the second connection elements and the third connection elements are flip chip connection elements.

12. The dual interface module of claim 11, wherein a covering layer is arranged on the contact pads and on the antenna pad.

13. The dual interface module of claim 12, wherein the substrate layer and the covering layer comprise the same material.

14. The dual interface module of claim 12, wherein the sum of the thickness of the covering layer and the thickness of the antenna pad is at least equal to the thickness of the electronic element.

15. A dual interface card comprising:
a plastic card body;
the dual interface module of claim 12 arranged on the plastic card body, wherein the substrate layer of the dual interface module covers the whole surface of the plastic card body; and
an adhesive layer arranged between the covering layer of the dual interface module and the plastic card body.

16. A method for manufacturing a dual interface card, the method comprising:
providing a plastic card body; and
bonding the dual interface module of claim 12 on the plastic card body using an adhesive, the substrate layer of the dual interface module covering the whole surface of the plastic card body.

17. A dual interface card comprising:
a plastic card body;
an indention arranged in the plastic card body; and
the dual interface module of claim 12 arranged on the plastic card body and in the indention, wherein the substrate layer of the dual interface module covers the whole surface of the plastic card body.

18. The dual interface card of claim 17, wherein an adhesive layer is arranged between the antenna pad of the dual interface module and the plastic card body.

19. The dual interface card of claim 18, wherein a resin is arranged inside the indention.

20. A method for manufacturing a dual interface card, the method comprising:
providing a plastic card body;
forming an indention in the plastic card body; and
bonding the dual interface module of claim 12 on the plastic card body using an adhesive, the substrate layer of the dual interface module covering the whole surface of the plastic card body, wherein a portion of the electronic element of the dual interface module is arranged in the indention.

21. The method according to claim 20, wherein a resin is inserted in the indention before bonding the dual interface module in the cavity.

22. A dual interface card comprising:
a plastic card body;
a cavity arranged in the plastic card body; and
the dual interface module of claim 1 arranged in the cavity.

23. The dual interface card of claim 22, wherein the cavity comprises an indention and wherein the substrate layer, the contact pads, the antenna pad and the first connection elements are completely arranged outside of the indention, the electronic element is arranged inside and outside of the indention, the connection pads are arranged at least outside of the indention, and the second connection elements and the third connection elements are arranged at least inside the indention.

24. The dual interface card of claim 23, wherein an adhesive layer is arranged between the antenna pad of the dual interface module and the plastic card body.

25. The dual interface card of claim 24, wherein the depth of the cavity not including the depth of the indention is at least equal to the sum of the thickness of the substrate layer, the antenna pad and the adhesive layer.

26. The dual interface card of claim 25, wherein the depth of the cavity not including the depth of the indention is equal to the sum of the thickness of the substrate layer, the antenna pad, the adhesive layer and the contact pads.

27. The dual interface card of claim 23, wherein a resin is arranged inside the indention.

28. The dual interface card of claim 22, wherein the dual interface module comprises a covering layer arranged on the contact pads and on the antenna pad and wherein an adhesive layer is arranged between the covering layer of the dual interface module and the plastic card body.

29. The dual interface card of claim 28, wherein the depth of the cavity is at least equal to the sum of the thickness of the substrate layer, the antenna pad, the covering layer and the adhesive layer.

30. The dual interface card of claim 29, wherein the depth of the cavity is equal to the sum of the thickness of the substrate layer, the antenna pad, the covering layer, the adhesive layer and the contact pads.

31. A method for manufacturing a dual interface card, the method comprising:
providing a plastic card body;
forming a cavity in the plastic card body; and
bonding the dual interface module of claim 1 in the cavity using an adhesive.

32. The method according to claim 31, wherein an indention is formed in the cavity and a portion of the electronic element of the dual interface module is arranged in the indention.

33. The method according to claim 32, wherein a resin is inserted in the indention before bonding the dual interface module in the cavity.

34. A method for manufacturing a dual interface module, the method comprising:
providing a substrate layer;
forming at least one dual interface section on the substrate layer;
forming at least two first through-holes in the substrate layer in each dual interface section;
arranging a first connection element in each first through-hole;
electrically connecting each first connection element to a contact pad that is arranged on a first side of the substrate layer;
electrically connecting each first connection element to a connection pad that is arranged on a second side of the substrate layer;
arranging at least one electronic element on the second side of the substrate layer in each dual interface section, wherein the electronic element is electrically connected to each of the connection pads in the same dual interface section; and
arranging an antenna pad comprising an antenna on the second side of the substrate layer in each dual interface section, wherein each electronic element is electrically connected to the antenna pad in the same dual interface section.

35. The method of claim 34, wherein the first connection elements are provided by covering the walls of the first through-holes with an electrically conductive material.

36. The method of claim 34, wherein the electronic element is electrically connected to each of the connection pads in the same dual interface section via a second connection element and electrically connected to the antenna pad in the same dual interface section via two third connection elements, and wherein all second connection elements and all third connection elements are wire bonds.

37. The method of claim 34, wherein the electronic element is electrically connected to each of the connection pads in the same dual interface section via flip chip connections and electrically connected to the antenna pad in the same dual interface section via flip chip connections.

38. The method of claim 34, wherein several dual interface sections are formed on the substrate layer and several dual interface modules are produced by cutting each dual interface section out of the substrate layer.

* * * * *